(12) United States Patent
Sugai

(10) Patent No.: US 6,174,563 B1
(45) Date of Patent: *Jan. 16, 2001

(54) METHOD FOR FORMING THIN METAL FILMS

(75) Inventor: Kazumi Sugai, Tokyo (JP)

(73) Assignee: NEC Corporation (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/110,491

(22) Filed: Jul. 6, 1998

(30) Foreign Application Priority Data

Jul. 7, 1997 (JP) .................................... 9-181520

(51) Int. Cl.[7] .............................. B05D 5/12; C23C 16/00; H07L 21/44

(52) U.S. Cl. .............................. 427/97; 427/99; 427/124; 427/255.28; 427/255.7; 438/652; 438/675; 438/680; 438/681

(58) Field of Search .................................... 427/252, 253, 427/255, 255.1, 97, 99, 124; 438/646, 652, 653, 680, 681, 687, 688, 675, 255.28, 255.7

(56) References Cited

U.S. PATENT DOCUMENTS

| | | | |
|---|---|---|---|
| 5,108,951 | * | 4/1992 | Chen et al. ........................... 438/688 |
| 5,151,305 | * | 9/1992 | Matsumoto et al. ................. 427/124 |
| 5,175,125 | * | 12/1992 | Wong ................................... 438/688 |
| 5,231,056 | * | 7/1993 | Sanshu ................................ 438/680 |
| 5,371,042 | * | 12/1994 | Ong ..................................... 438/688 |
| 5,523,259 | * | 6/1996 | Merchant et al. ................... 438/688 |
| 5,545,591 | * | 8/1996 | Sugai et al. ......................... 438/681 |

FOREIGN PATENT DOCUMENTS

| | | | |
|---|---|---|---|
| 3291920 | 12/1991 | (JP) | ............................... H01L/21/28 |
| 41498 | 1/1992 | (JP) | ........................... H01L/21/3205 |
| 5136138 | 6/1993 | (JP) | ........................... H01L/21/3205 |
| 115073 | * 5/1995 | (JP) | . |
| 7-115073 | 5/1995 | (JP) | ............................... H01L/21/28 |
| 8-8253 | 1/1996 | (JP) | ........................... H01L/21/3205 |

OTHER PUBLICATIONS

"Sub–Half Micron Aluminum Metallization Technology Using a Combination of CVD and Sputtering" Sugai et al Jun. 8–9, 1993; VMIC Conference; pp. 463–469.

* cited by examiner

Primary Examiner—Brian K. Talbot
(74) Attorney, Agent, or Firm—Hayes, Soloway, Hennesey, Grossman & Hage, P.C.

(57) ABSTRACT

A method for forming metal thin films for wiring wherein the formation of the metal films by chemical vapor deposition technique is carried out in two steps, with the deposition temperature of the second step being set to be higher than the deposition temperature of the first step, whereby a via hole or a wiring groove can be embedded without the formation of voids. As a result a highly reliable wiring can be achieved even on a fine LSI.

10 Claims, 2 Drawing Sheets

METHOD FOR FORMING THIN METAL FILMS

BACKGROUND OF THE INVENTION

1. Field of the Invention

The present invention relates to a method for forming thin metal films, and more specifically, it relates to a method for forming thin metal films for wiring.

2. Description of the Related Art

For forming high integration and high speed LSIs, the design of the LSIs becomes more exacting, so that as the width of wires and the diameter of via holes decrease, there results an increase of the aspect ration. As a method of embedding the grooves for wires and the via holes, there has been developed a method for forming metal films by chemical vapor deposition technique which in principle provides excellent step coverage.

An example of conventional formation methods of thin metal films is shown in FIG. 2. This conventional example is described in "Proceedings of VLSI Multilevel Interconnection Conference", 1993, p. 463–469. According to this formation method of thin metal films, an insulating film 102 is first deposited all over the surface of a substrate 101 as shown in FIG. 2(a), and a via hole 104 is then bored. In succession, a barrier metal 103 is deposited. Next, an aluminum film 105 is deposited in accordance with a chemical vapor deposition technique using dimethylaluminum-hydride. At this time, a void 106 occasionally is formed in the via hole 104, as shown in FIG. 2(b). The formation of the void is caused by the fact that the aluminum film deposited by the chemical vapor deposition technique has a rough surface. That is to say, in the course of the deposition of the aluminum film, the surface of the aluminum film is chapped, and recesses of the film come in contact with each other in the upper portion of the via hole, whereby the feed of raw material to the inside of the via hole is blocked, so that the recesses remain in the form of the void.

In the above-mentioned conventional example, current density increases due to the void in the via hole, so that the migration phenomenon of an aluminum atom by current called electromigration increases, with the result that wires are liable to be broken and the reliability of the wiring deteriorates inconveniently.

SUMMARY OF THE INVENTION

An object of the present invention is to provide a method for forming thin metal films which solve the above-mentioned problems of the prior art and which can accomplish the complete embedding of a via hole.

The aspects of the present invention are as follows:

A method for forming thin metal films for wiring which comprises a step of depositing an insulating film on a substrate and forming a via hole or a groove for wiring in the insulating film, a step of forming, by a chemical vapor deposition technique, a first metal film as an undercoat all over the surface of the substrate on which the via hole or the groove for wiring is formed, and a step of forming a second metal film of the same kind of metal as the first metal film to a desired thickness at a temperature higher than a deposition temperature at the time of the formation of the first metal film by the chemical vapor deposition technique.

In forming thin metal films in accordance with the present invention there is used as a raw material for the chemical vapor deposition of the first metal film, a material having a decomposition temperature lower than the decomposition temperature of a raw material used in the chemical vapor deposition of the second metal film.

Preferably the main component of the first and second metal films is aluminum or copper.

In a particularly preferred embodiment of the invention the raw material of the first and second metal films is selected from the group consisting of triisobutylaluminum (TIBA), dimethylaluminum-hydride (DMAH), monomethylaluminum-dihydride (MMADH), diethylaluminum-hydride (DEAH), trimethylaminealane (TMAA), triethylaminealane (TEAA) and dimethylethylaminealane (DMEAA) or the raw material of the first and second metal films is selected from the group consisting of hexafluoroacetylacetonatocopper trimethylvinylsilane (hfac)Cu(VTMS), cyclopentadienyltriethylphosphinecopper CpCuTEP, acetylacetonatocopper $Cu(ACAC)_2$, dipivaloyl-methanecopper $Cu(DPM)_2$, heptafluorobutanoylpivaloyl-methanecopper $Cu(FOD)_2$, pentafluoropropanoylpivaloyl-methanecopper $Cu(PPM)_2$ and hexafluorobutanoylpivaloylmethanecopper $Cu(HFA)_2$.

DETAILED DESCRIPTION OF THE PREFERRED EMBODIMENTS

An embodiment of the present invention will be described in detail with reference to drawings.

Figure 1A:
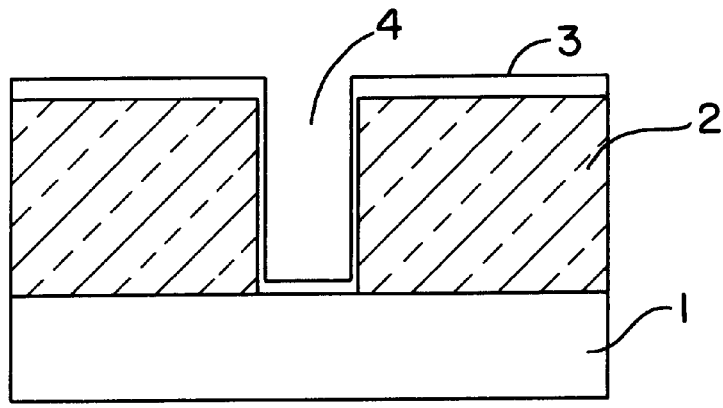
FIG. 1 is a cross-sectional view illustrating one process of a formation method of thin metal films of the present invention.

In (a) of FIG. 1, an insulating film 2 is deposited on a substrate 1, and a via hole 4 covered with a barrier metal 3 is then formed in a conventional manner.

Next, as shown in (b) of FIG. 1, a first metal film 5 is formed on the barrier metal 3 by a chemical vapor deposition technique.

Thereafter, as shown in (c) of FIG. 1, a second metal film 6 is formed.

In this case, the first metal film 5 is a fine smooth thin undercoat film, and the second metal film 6 is formed to a desired thickness at a temperature higher than a temperature at which the first metal film 5 is formed. This construction is a feature of the present invention.

In the first chemical vapor deposition, if the substrate temperature is raised, the embedding of the via hole or a wiring groove cannot be completely achieved. This reason can be explained as follows:

Aluminum or copper grows in accordance with Volmer-weber type growth manner, and at an early stage of the growth, islands of metal are formed, and as the growth progresses, these islands coalesce to each other to form a film. With such growth, if the substrate temperature is high, the density of the islands is low, and some islands predominantly grow, whereby the via hole may become closed at its upper portion while the islands remain in the via hole as they are.

On the other hand, in the second chemical vapor deposition, if a substrate temperature is not raised, the molecules of the raw material and decomposed substances of these raw material molecules cannot sufficiently move, so that the inside of the via hole or the wiring groove cannot become completely embedded and a void may remain therein.

Figure 3:
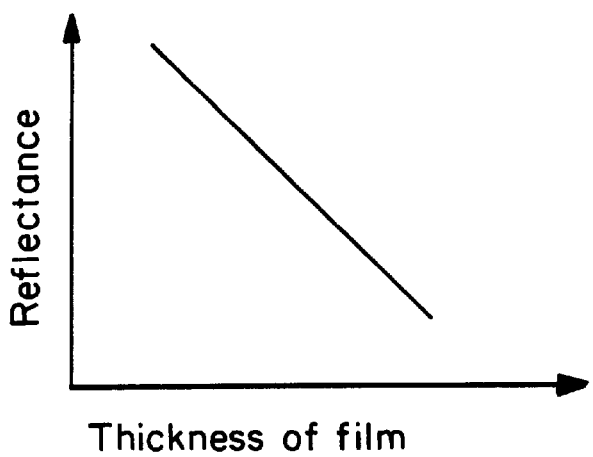
FIG. 3 is a graph showing a reflectance of an aluminum film which indicates the smoothness of a film surface to the thickness of the aluminum film.

In a case where an aluminum film is formed as a metal film, surface roughness of the aluminum film which causes void formation in the aluminum film in the via hole depends on the thickness of the aluminum film. That is to say, as shown in FIG. 3, it has been described in the above-mentioned conventional example that reflectance of the film which indicates the smoothness of the film decreases with the increase of the thickness of the aluminum film. Therefore, a thin aluminum film can possess a smooth surface.

Thus, as the first step, a thin, fine and smooth metal film is first deposited all over the substrate by a chemical vapor deposition technique which provides excellent step coverage. Then, in a second step, the substrate temperature is raised, and a raw material for depositing the same kind of metal is used and a chemical vapor deposition technique is then carried out until a desired thickness is reached. The surface mobility of the raw material itself of the metal and the decomposed substances of the raw material on the already formed thin film increases with the rise of the temperature. Furthermore, such decomposed substances physically adsorbed on the film surface apt to stagnate in geometrical recesses, and in such sites, they are chemically adsorbed to become a film. In consequence, the via hole can be embedded with the metal without forming any void in the via hole. A similar effect has been observed in the case of a wiring groove.

In the case that the main component of the first and second metal films is aluminum, examples of raw material which can be used in the present invention include triisobutylaluminum (TIBA), dimethylaluminum-hydride (DMAH), monomethylaluminum-dihydride (MMADH), diethylaluminum-hydride (DEAH), trimethylaminealane (TMAA), triethylaminealane (TEAA) and dimethylethylaminealane (DMEAA), and mixtures and intermolecular compounds thereof.

The chemical vapor deposition conditions of these raw materials (single use) are shown in Table 1.

TABLE 1

Chemical Vapor Deposition Conditions of Aluminum Raw Material

| Raw Material | Film Formation Temp. (° C.) |
| --- | --- |
| TIBA | 200–500 |
| DMAH | 100–300 |
| MMADH | 100–300 |
| DEAH | 100–300 |
| TMAA | 70–500 |
| TEAA | 70–500 |
| DMEAA | 70–500 |

As a carrier gas, there can be used a rare gas such as argon, and nitrogen, other than hydrogen.

The substrate temperatures for the first and second chemical vapor deposition steps should be selected to fall within the film formation temperature ranges for the respective usable raw materials shown in the above-mentioned table so that the temperature of the first chemical vapor deposition step is such a temperature as to permit the formation of a fine smooth undercoat and so that the temperature of the second chemical vapor deposition step is higher than that of the first chemical vapor deposition step, whereby the embedding of the via hole can be accomplished without forming any void.

Needless to say, the first and second chemical vapor deposition steps can be carried out only by changing the temperature with one kind of raw material.

In the case that the main component of the first and second metal films is copper, examples of the raw material which can be used in the present invention include hexafluoroacetylacetonatocopper trimethylvinylsilane (hfac)Cu (VTMS), cyclopentadienyltriethylphosphinecopper CpCuTEP, acetylacetonatocopper $Cu(ACAC)_2$, dipivaloylmethanecopper $Cu(DPM)_2$, heptafluorobutanoylpivaloylmethanecopper $Cu(FOD)_2$, pentafluoropropanoylpivaloylmethanecopper $Cu(PPM)_2$ and hexafluorobutanoylpivaloylmethanecopper $Cu(HFA)_2$, and mixtures and intermolecular compounds thereof.

The chemical vapor deposition conditions of these raw materials (single use) are shown in Table 2.

TABLE 2

Chemical Vapor Deposition Conditions of Copper Raw Material

| Raw Material | Film Formation Temp. (° C.) |
| --- | --- |
| (hfac)Cu(VTMS) | 150–400 |
| CpCuTEP | 100–400 |
| $Cu(ACAC)_2$ | 150–400 |
| $Cu(DPM)_2$ | 100–400 |
| $Cu(FOD)_2$ | 120–400 |
| $Cu(PPM)_2$ | 90–400 |
| $Cu(HFA)_2$ | 70–400 |

The substrate temperatures for the first and second chemical vapor deposition steps should be selected to fall within the film formation temperature ranges for the respective usable raw materials shown in the above-mentioned table so that the temperature of the first chemical vapor deposition step is such a temperature as to permit the formation of a fine smooth undercoat and so that the temperature of the second chemical vapor deposition step is higher than that of the first chemical vapor deposition step, whereby the embedding of the via hole can be accomplished without forming any void.

Needless to say, the first and second chemical vapor deposition steps can be carried out only by changing the temperature with one kind of raw material.

Next, an embodiment of the present invention will be described in more detail with reference to drawings.

This embodiment is connected to a case where the present invention is applied to a wiring process in a silicon integrated circuit, and referring to FIG. 1.

Figure 1B:
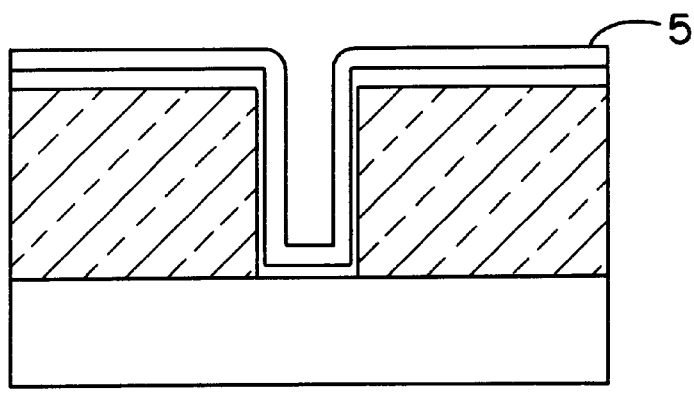
Figure 1C:
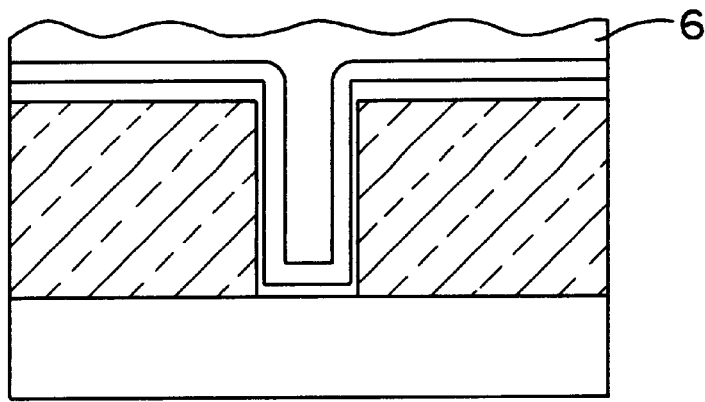
Figure 2A:
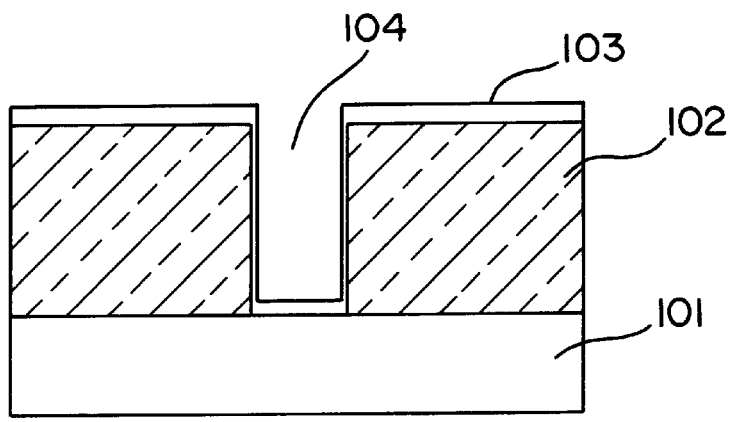
FIG. 2 is a cross-sectional view illustrating the main process of a conventional formation method of metal thin films.
Figure 2B:
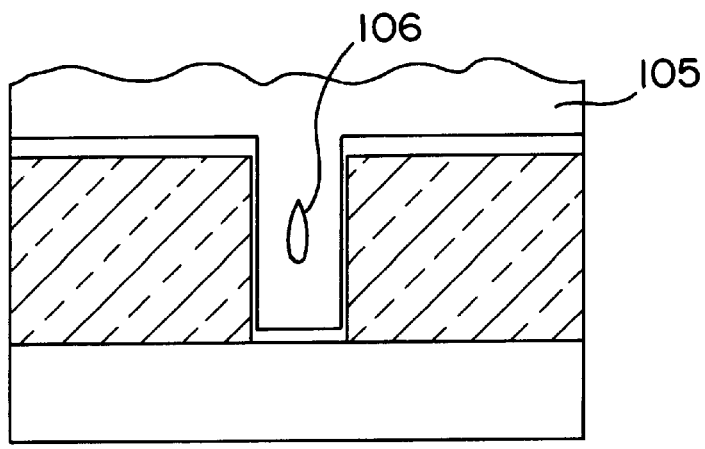

FIG. 1 shows a substrate which is prepared by the use of a standard integrated circuit manufacturing method and which has a structure where aluminum wiring has not yet been made. In this drawing, reference numeral 1 is a substrate, numeral 2 is an insulating film, 3 is a barrier metal, and 4 is a via hole with about 0.18 μm in diameter. In this embodiment, titanium is used as the barrier metal. Next, as shown in FIG. 1(b), a first metal film 5 comprising aluminum and having a thickness of about 50 nm is formed as an undercoat on the barrier metal 3 by a chemical vapor deposition method. The chemical vapor deposition is carrier out by using dimethylaluminum-hydride as an aluminum raw material and hydrogen gas as a carrier gas at a carrier gas flow rate of 50 to 3000 sccm at a substrate temperature of 100 to 200° C. under a growth chamber pressure of 0.01 to 100 Torr. Next, the substrate temperature is raised to 250 to 500° C. without breaking the vacuum state, and the aluminum raw material is then changed to triisobutylaluminum. Hydrogen gas is then used as the carrier gas at a flow rate of 50 to 3000 sccm, and chemical vapor deposition is carried out under a growth chamber pressure of 0.01 to 10 Torr. At this time, as shown in FIG. 1(c), a second metal film 6 comprising aluminum is deposited. Since this second film is formed at a temperature higher than the first film, aluminum can be embedded in the via hole without forming any void.

In order to accomplish good embedding, it is important to inhibit the formation of a polluted layer such as a native oxide film on the first aluminum film. For this inhibition, the amount of oxidizing atmosphere such as oxygen or water, or polluting atmosphere which is exposed to aluminum between a formation step of the first aluminum film and a formation step of the second aluminum film is controlled to 1 L or less.

In this embodiment, titanium is used as the barrier metal, but also when any of nitrogen compounds such as titanium nitride and tungsten nitride, refractory metals such as tungsten and their compounds is used, a similar effect can be obtained.

In this embodiment, with regard to the aluminum raw materials, dimethylaluminum-hydride is used as the raw material for the first chemical vapor deposition, and triisobutylaluminum is used as the raw material for the second chemical vapor deposition, but even when any one of monomethylaluminum-dihydride (MMADH), diethylaluminum-hydride (DEAH), trimethylaminealane (TMAA), triethylaminealane (TEAA) and dimethylethylaminealane (DMEAA), or a mixture or an intermolecular compound containing them is used, a similar effect can be obtained, if the chemical vapor deposition is carried out under conditions that a temperature of the second film formation is higher than that of the first undercoat formation. The conditions of the chemical vapor deposition in the case that these raw materials are used have been already shown in Table 1.

As a carrier gas, also when a rare gas such as argon and nitrogen is used in place of hydrogen, a similar effect can be obtained.

In the case where copper is used instead of aluminum, the raw materials in Table 2 given above are selected so as to be used at a substrate temperature which is suitable for the chemical vapor deposition for the first undercoat formation and, in the second chemical vapor deposition, so as to be used at a substrate temperature higher than that for the first undercoat formation, whereby embedding can be accomplished without the formation of any void.

In the present invention, the formation of metal films by chemical vapor deposition technique is carried out in two steps, and the deposition temperature for forming the metal film in the second step is set so as to be higher than the deposition temperature for forming the fine smooth metal undercoat film in the first step, so that a via hole or a wiring groove can be embedded without the formation of any void. As a consequence, a highly reliable wiring can be achieved even on a fine LSI, and so the chip area of the LSI can be reduced, whereby the manufacturing cost of the LSI can be decreased.

What is claimed is:

1. In a method for forming an integrated circuit which includes a metal film layer for wiring, wherein an insulating film is deposited on a substrate, and a via hole or a groove for wiring is formed in the insulating film and filled with metal, the improvement wherein the metal filling is formed by a two step chemical vapor deposition comprising a first discrete step wherein a first metal film is formed on surfaces defining said via hole or groove for wiring by chemical vapor deposition of a first raw material containing said metal at a first deposition temperature, and a second discrete step wherein a second metal film having a thickness greater than a thickness of said first metal film is formed directly on said first metal film to completely fill said via hole or groove for wiring by chemical vapor deposition of a second raw material containing the same said metal at a second deposition temperature higher than said first deposition temperature wherein said first raw material is different from said second raw material.

2. In a method according to claim 1, wherein the first raw material used in the chemical vapor deposition in the first discrete step has a decomposition temperature lower than the decomposition temperature of the second raw material used in the chemical vapor deposition in the second discrete step.

3. In a method according to claim 1, wherein the first and the second raw materials both comprise aluminum as the metal component.

4. In a method according to claim 3, wherein the first and second raw materials each comprise a different material selected from the group consisting of triisobutylaluminum (TIBA), dimethylaluminum-hydride (DMAH), monomethylaluminum-dihydride (MMADH), diethylaluminum-hydride (DEAH), trimethylaminealane (TMAA), triethylaminealane (TEAA) and dimethylethylaminealane (DMEAA).

5. In a method according to claim 1, wherein the first and the second raw materials both comprise copper as the metal component.

6. In a method according to claim 5, wherein the first and second raw materials each comprise a different material selected from the group consisting of hexafluoroacetylacetonatocopper trimethylvinylsilane (hfac)Cu(VTMS), cyclopentadienyltriethylphosphinecopper (CpCuTEP), acetylacetonatocopper Cu(ACAC)$_2$, dipivaloylmethanecopper Cu(DPM)$_2$, heptafluorobutanoylpivaloylmethanecopper Cu(FOD)$_2$, pentafluoropropanoylpivaloylmethanecopper Cu(PPM)$_2$ and hexafluorobutanoylpivaloylmethanecopper Cu(HFA)$_2$.

7. In a method according to claim 2, wherein the first and second raw materials both comprise aluminum as the metal component.

8. In a method according to claim 7, wherein the first and second raw materials each comprise a different material selected from the group consisting of triisobutylaluminum (TIBA), dimethylaluminum-hydride (DMAH), monomethylaluminum-dihydride (MMADH), diethylaluminum-hydride (DEAH), trimethylaminealane (TMAA), triethylaminealane (TEAA) and dimethylethylaminealane (DMEAA).

9. In a method according to claim 2, wherein the first and second raw materials both comprise copper as the metal component.

10. In a method according to claim 9, wherein the first and second raw materials each comprise a different material selected from the group consisting of hexafluoroacetylacetonatocopper trimethyl-vinylsilane (hfac)Cu(VTMS), cyclopentadienyltriethylphosphinecopper (CpCuTEP), acetylacetonatocopper Cu(ACAC)$_2$, dipivaloylmethanecopper Cu(DPM)$_2$, heptafluorobutanoylpivaloylmethanecopper Cu(FOD)$_2$, pentafluoropropanoylpivaloylmethanecopper Cu(PPM)$_2$ and hexafluorobutanoylpivaloylmethanecopper Cu(HFA)$_2$.

* * * * *

UNITED STATES PATENT AND TRADEMARK OFFICE
CERTIFICATE OF CORRECTION

PATENT NO. : 6,174,563 B1
DATED : January 16, 2001
INVENTOR(S) : Kazumi Sugai

Page 1 of 1

It is certified that error appears in the above-identified patent and that said Letters Patent is hereby corrected as shown below:

<u>Column 6, claim 6,</u>
Line 41, insert -- ( -- before "Cu".
Line 42, insert -- ( -- before "Cu".

Signed and Sealed this

Nineteenth Day of February, 2002

Attest:

Attesting Officer

JAMES E. ROGAN
*Director of the United States Patent and Trademark Office*